(12) United States Patent
Cheng et al.

(10) Patent No.: US 12,411,529 B2
(45) Date of Patent: Sep. 9, 2025

(54) CONNECTION COMPONENT AND MOBILE TERMINAL

(71) Applicant: VIVO MOBILE COMMUNICATION CO., LTD., Guangdong (CN)

(72) Inventors: Dongcun Cheng, Guangdong (CN); Zhengjun Luo, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 392 days.

(21) Appl. No.: 17/407,298

(22) Filed: Aug. 20, 2021

(65) Prior Publication Data

US 2021/0382527 A1  Dec. 9, 2021

Related U.S. Application Data

(63) Continuation of application No. PCT/CN2020/073955, filed on Jan. 23, 2020.

(30) Foreign Application Priority Data

Feb. 22, 2019 (CN) .......................... 201910133644.0

(51) Int. Cl.
  *G06F 1/16* (2006.01)
  *E05D 3/14* (2006.01)
  *H05K 5/02* (2006.01)

(52) U.S. Cl.
  CPC .......... *G06F 1/1681* (2013.01); *G06F 1/1616* (2013.01); *H05K 5/0226* (2013.01)

(58) Field of Classification Search
  CPC .. E05D 3/18; E05D 3/142; E05D 3/14; G06F 1/1681; G06F 1/1616; H05K 5/0226
  See application file for complete search history.

(56) References Cited

U.S. PATENT DOCUMENTS

| | | | | |
|---|---|---|---|---|
| 1,772,559 A | * | 8/1930 | Soss ......................... | E05D 3/14 16/379 |
| 2,073,689 A | * | 3/1937 | Gotzinger ................. | E05D 3/18 16/358 |

(Continued)

FOREIGN PATENT DOCUMENTS

| CN | 102207238 A | 10/2011 |
|---|---|---|
| CN | 203532505 U | 4/2014 |

(Continued)

OTHER PUBLICATIONS

English machine translation of CN104806626 (Year: 2015).*

*Primary Examiner* — Emily M Morgan
(74) *Attorney, Agent, or Firm* — Price Heneveld LLP

(57) ABSTRACT

A connection component and a mobile terminal are provided, where the connection component includes a first base, a second base, and a connection mechanism, the first base includes a first accommodation groove, the second base includes a second accommodation groove, and the connection mechanism is rotatably connected to the first base and the second base separately to enable the first base and the second base to switch between an extended state and a folded state. In the extended state, the first base and the second base are adjacent and coplanar, and the first accommodation groove is adjacent to the second accommodation groove. In the folded state, the first base and the second base are overlapped, the first accommodation groove is opposite to the second accommodation groove, and the connection mechanism is accommodated in the first accommodation groove and the second accommodation groove.

16 Claims, 6 Drawing Sheets

(56) References Cited

U.S. PATENT DOCUMENTS

| | | | | |
|---|---|---|---|---|
| 2,206,739 | A * | 7/1940 | Brogren | E05D 3/127 16/354 |
| 4,780,929 | A * | 11/1988 | Burns | A63C 5/02 16/349 |
| 5,044,044 | A * | 9/1991 | Young | E05D 3/18 16/349 |
| 8,434,197 | B2 * | 5/2013 | Oshima | E05D 3/186 16/241 |
| 9,983,637 | B1 * | 5/2018 | Morrison | G06F 1/1647 |
| 10,100,970 | B1 * | 10/2018 | Wu | H05K 5/0226 |
| 10,435,933 | B2 * | 10/2019 | Lin | E05D 11/1028 |
| 11,054,865 | B2 * | 7/2021 | Jan | G06F 1/1618 |
| 11,543,862 | B2 * | 1/2023 | Ren | G06F 1/1616 |
| 2007/0294860 | A1 * | 12/2007 | Hoffman | E05D 5/0207 16/368 |
| 2010/0328860 | A1 | 12/2010 | Kim et al. | |
| 2011/0235257 | A1 | 9/2011 | Chan et al. | |
| 2012/0117757 | A1 * | 5/2012 | Oshima | E05D 7/0423 16/236 |
| 2015/0167366 | A1 * | 6/2015 | Armstrong | E05D 3/14 16/370 |
| 2017/0138103 | A1 * | 5/2017 | Hong | E05D 3/18 |
| 2017/0254127 | A1 | 9/2017 | Uchiyama et al. | |
| 2017/0294632 | A1 | 10/2017 | Liao | |
| 2017/0310799 | A1 | 10/2017 | Lin | |
| 2018/0341295 | A1 * | 11/2018 | Lan | G06F 1/1679 |
| 2019/0146560 | A1 * | 5/2019 | Jan | H05K 5/0017 361/679.27 |
| 2021/0196085 | A1 * | 7/2021 | Placencia | E05D 7/1072 |

FOREIGN PATENT DOCUMENTS

| | | | |
|---|---|---|---|
| CN | 104806626 A | * | 7/2015 |
| CN | 105987262 A | | 10/2016 |
| CN | 207393719 U | | 5/2018 |
| CN | 207634506 U | * | 7/2018 |
| CN | 108769317 A | | 11/2018 |
| CN | 109936649 A | | 6/2019 |
| JP | 2132981 U | | 5/1990 |
| JP | 2017155854 A | | 9/2017 |

* cited by examiner

CONNECTION COMPONENT AND MOBILE TERMINAL

CROSS-REFERENCE TO RELATED APPLICATIONS

This application is continuation application of PCT International Application No. PCT/CN2020/073955 filed on Jan. 23, 2020, which claims priority to Chinese Patent Application No. 201910133644.0 filed in China on Feb. 22, 2019, the disclosures of which are incorporated in their entireties by reference herein.

TECHNICAL FIELD

The present disclosure relates to the technical field of rotating shafts, and in particular, to a connection component and a mobile terminal.

BACKGROUND

Currently, a foldable mobile terminal usually includes a first body, a second body, and a rotating shaft connecting the first body to the second body. When the first body and the second body are in a folded state, the rotating shaft is exposed on outer surfaces of the first body and the second body. In other words, the rotating shaft protrudes out from the first body and the second body, which affects a user's sense of gripping and spoils an appearance of the foldable mobile terminal.

SUMMARY

Embodiments of the present disclosure provide a connection component and a mobile terminal, to resolve the following problems of a current foldable mobile terminal: Because a rotating shaft is exposed, a user's sense of gripping is poor, and an appearance of the foldable electronic device is spoiled.

To resolve the foregoing technical problems, the present disclosure is implemented as follows:

According to a first aspect, a connection component is provided, including: a first base, where the first base includes a first accommodation groove; a second base, where the second base includes a second accommodation groove; and a connection mechanism, where the connection mechanism is rotatably connected to the first base and the second base separately to enable the first base and the second base to switch between an extended state and a folded state.

In the extended state, the first base and the second base are adjacent and coplanar, and the first accommodation groove is adjacent to the second accommodation groove.

In the folded state, the first base and the second base are overlapped, the first accommodation groove is opposite to the second accommodation groove, and the connection mechanism is accommodated in the first accommodation groove and the second accommodation groove.

According to a second aspect, a mobile terminal is provided, including: a first display component, a second display component, and a connection component, where the connection component connects the first display component to the second display component and is the connection component according to the first aspect, the first base is connected to the first display component, and the second base is connected to the second display component.

According to the embodiments of the present disclosure, the connection component replaces a rotating shaft of a current foldable mobile terminal. When the mobile terminal is in a folded state, the connection component can be hidden in the mobile terminal, which does not affect a user's sense of gripping or spoil an appearance of the mobile terminal.

BRIEF DESCRIPTION OF DRAWINGS

The accompanying drawings described herein are intended to provide a further understanding of the present disclosure, and constitute a part of the present disclosure. The illustrative embodiments of the present disclosure and descriptions thereof are intended to describe the present disclosure, and do not constitute limitations on the present disclosure. In the accompanying drawings.

DESCRIPTION OF EMBODIMENTS

The technical solutions in the embodiments of the present disclosure are described below clearly with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure without creative efforts shall fall within the protection scope of the present disclosure.

Figure 1:
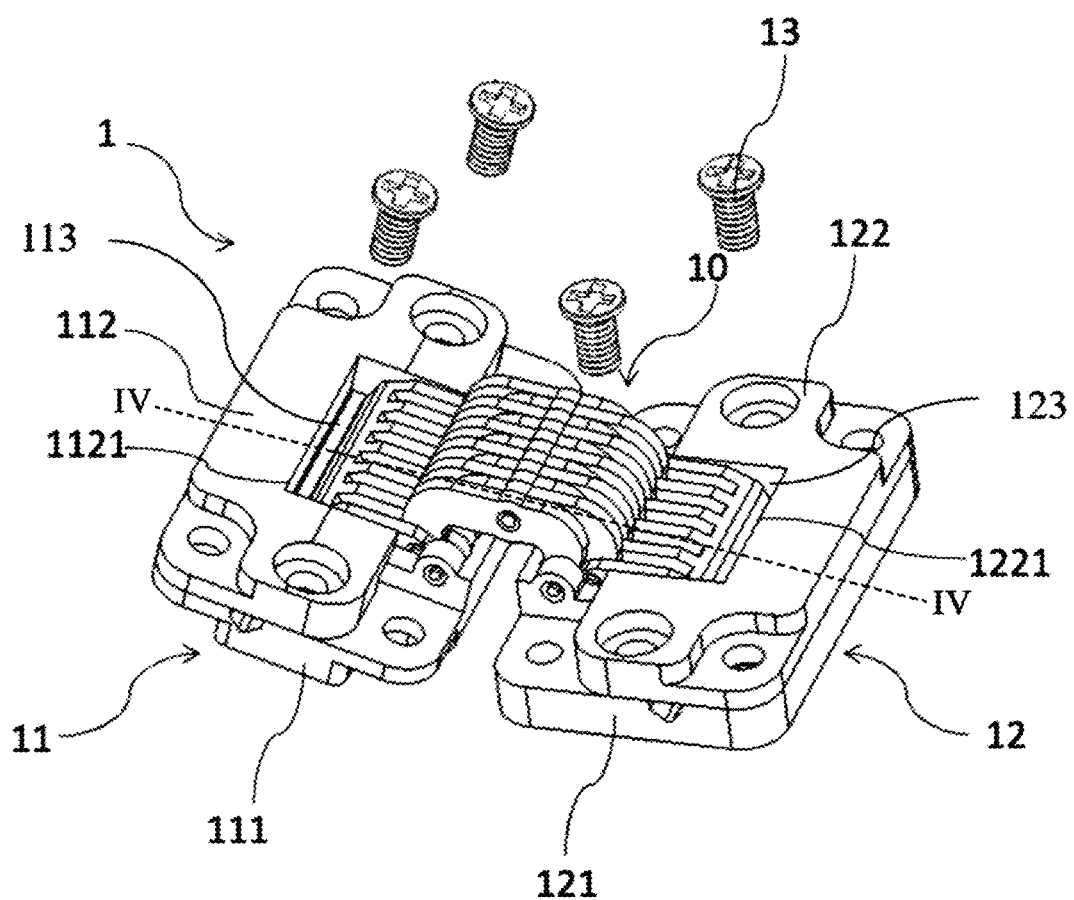
FIG. 1 is a schematic diagram of a connection component according to a first embodiment of the present disclosure.
Figure 2:
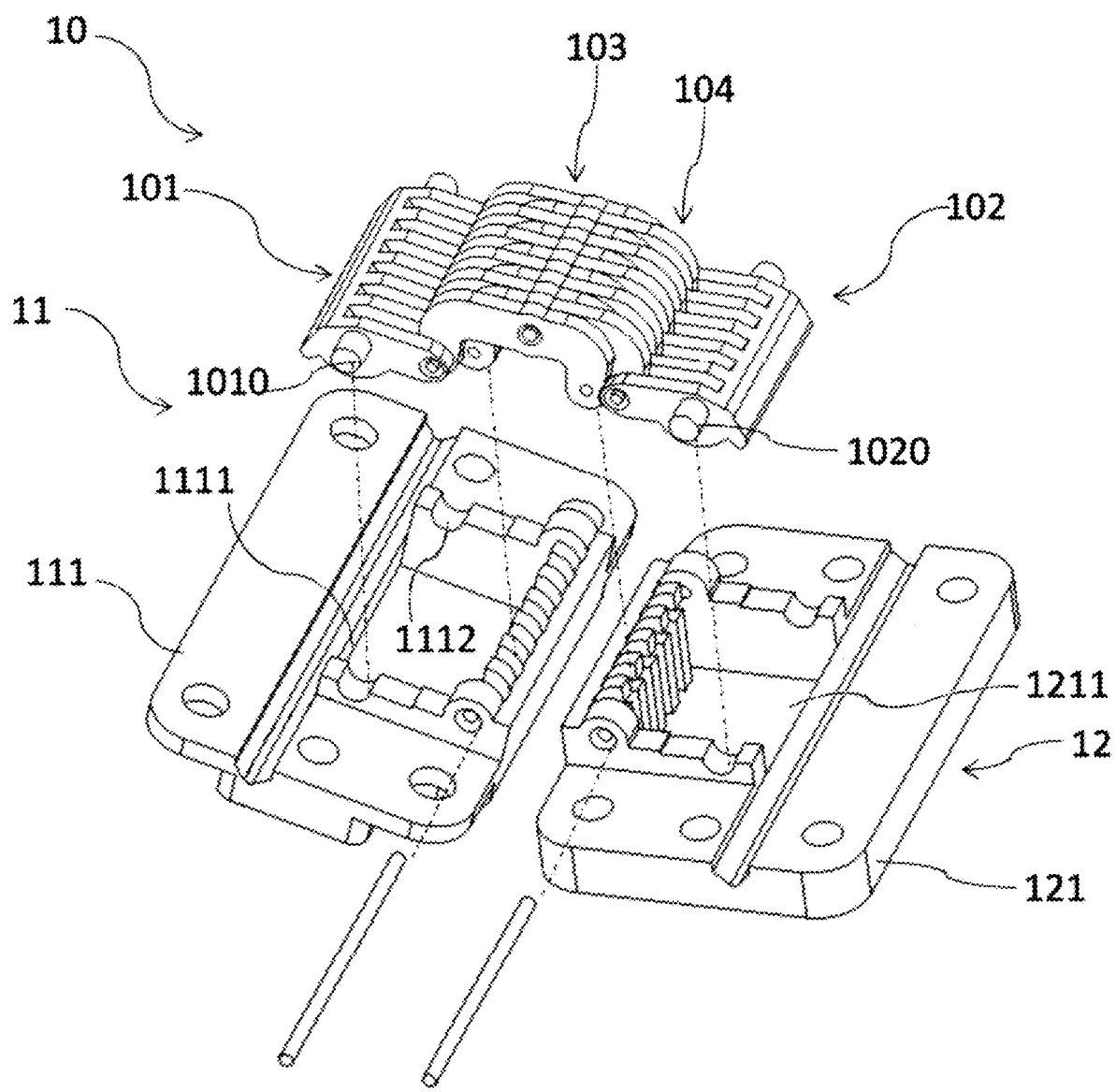
FIG. 2 is a schematic exploded diagram of the connection component according to the first embodiment of the present disclosure.

FIG. 1 and FIG. 2 are schematic diagrams of a connection component according to a first embodiment of the present disclosure. As shown in the figures, the connection component 1 in this embodiment includes a connection mechanism 10, a first base 11, and a second base 12. The first base 11 includes a first accommodation groove (113). The second base 12 includes a second accommodation groove (123). The connection mechanism 10 is rotatably connected to the first base 11 and the second base 12 to enable the first base 11 and the second base 12 to switch between an extended state and a folded state. In the extended state, the first base 11 and the second base 12 are adjacent and coplanar, and the opening of the first accommodation groove (1131) is adjacent to the opening of the second accommodation groove (1231). In the folded state, the first base 11 and the second base 12 are overlapped, the opening of the first accommodation groove (1131) is opposite to the opening of the second accommodation groove (1231), and the connection mechanism 10 is accommodated in the first accommodation groove (113) and the second accommodation groove (123).

Figure 3:
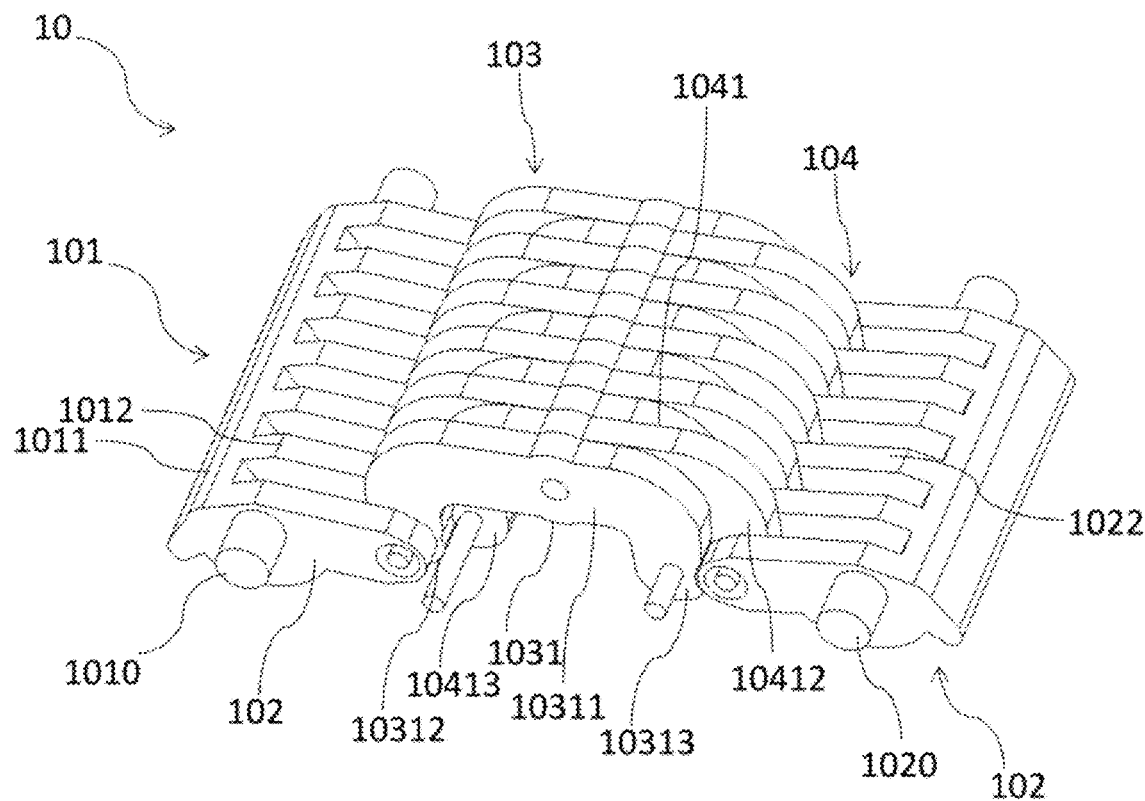
FIG. 3 is a schematic diagram of a connection mechanism according to the first embodiment of the present disclosure.

Referring to FIG. 3 together, FIG. 3 is a schematic diagram of the connection mechanism according to the first embodiment of the present disclosure. As shown in the figure, the connection mechanism 10 includes a first connection piece 101, a second connection piece 102, a first adapter 103, and a second adapter 104. The first connection piece 101 is rotatably connected to the first base 11. The first connection piece 101 is located in the first accommodation groove (113). The second connection piece 102 is rotatably connected to the second base 12, and is located in the second accommodation groove (123). The first adapter 103 is disposed between the first connection piece 101 and the second connection piece 102. A first end of the first adapter 103 is rotatably connected to the first connection piece 101. The second adapter 104 is disposed between the first adapter 103 and the second connection piece 102. A first end of the second adapter 104 is rotatably connected to the second connection piece 102. A second end of the second adapter 104 is rotatably connected to the first base 11.

The first connection piece 101 is rotatably connected to the first base 11, and has a first pivot shaft 1010. The first pivot shaft 1010 is rotatably connected to the first base 11. Similarly, the second connection piece 102 is rotatably connected to the second base 12, and has a second pivot shaft 1020. The second pivot shaft 1020 is rotatably connected to the second base 12.

In this embodiment, the first adapter 103 is formed as a first blade 1031, a first end of the first blade 1031 is rotatably connected to the first connection piece 101, and a second end of the first blade 1031 is rotatably connected to the second base 12. The second adapter 104 is formed as a second blade 1041, a first end of the second blade 1041 is rotatably connected to the second connection piece 102, and a second end of the second blade 1041 is rotatably connected to the first base 11. The first blade 1031 is disposed in parallel to the second blade 1041. A middle of the first blade 1031 is rotatably connected to that of the second blade 1041. In this embodiment, the first adapter 103 has a plurality of first blades 1031 that are disposed at intervals in parallel to each other. The second adapter 104 has a plurality of second blades 1041 that are disposed at intervals in parallel to each other. The second blade 1041 is disposed between every two adjacent first blades 1031. The first blade 1031 is disposed between every two adjacent second blades 1041. The first blades 1031 and the second blades 1041 are alternately disposed one by one. Certainly, the plurality of first blades 1031 and the plurality of second blades 1041 may not be alternately disposed one by one. There may be a plurality of second blades 1041 between every two adjacent first blades 1031. There may be a plurality of first blades 1031 between every two adjacent second blades 1041.

Certainly, the first adapter 103 may have a plurality of first blades 1031, the second adapter 104 may have a single second blade 1041, and the second blade 1041 is disposed between two adjacent first blades 1031. Alternatively, the second adapter 104 may have a plurality of second blades 1041, the first adapter 103 may have a single first blade 1031, and the first blade 1031 is disposed between two adjacent second blades 1041.

A surface of the first blade 1031 that faces the second blade 1041 is tightly attached to a surface of the second blade 1041 that faces the first blade 1031. When the first blade 1031 rotates relative to the second blade 1041, a damping force is generated between the first blade 1031 and the second blade 1041. In this way, a damping connection is achieved between the first blade 1031 and the second blade 1041. In other words, when the first adapter 103 rotates relative to the second adapter 104, a rotation angle of the first adapter 103 relative to the second adapter 104 is controlled by the damping force between the first blade 1031 and the second blade 1041.

In this embodiment, the first blade 1031 has a same structure as the second blade 1041. The following uses only the first blade 1031 for description. The first blade 1031 includes a body part 10311, a first adapter wing 10312, and a second adapter wing 10313. The body part 10311 extends in a direction from the first base 11 to the second base 12, and is rotatably connected to the second blade 1041. The first adapter wing 10312 is connected to an axial end of the body part 10311, and extends from one side of the body part 10311 towards a direction away from the body part 10311. The first adapter wing 10312 is rotatably connected to the first connection piece 101. The second adapter wing 10313 is connected to the other axial end of the body part 10311, extends from the side of the body part 10311 towards a direction away from the body part 10311, and is rotatably connected to the second base 12. The body part 10311, the first adapter wing 10312, and the second adapter wing 10313 are coplanar. The first adapter wing 10312 is parallel to the second adapter wing 10313, and the first adapter wing 10312 and the second adapter wing 10313 are separately orthogonal to the body part 10311.

The body part 10411 of the second blade 1041 is rotatably connected to the first blade 1031. The first adapter wing 10412 of the second blade 1041 is rotatably connected to the second connection piece 102. The second adapter wing 10413 of the second blade 1041 is rotatably connected to the first base 11.

In this embodiment, the first connection piece 101 has a same structure as the second connection piece 102. The following describes only the structure of the first connection piece 101. The first connection piece 101 includes a connection part 1011 and a connection blade 1012. The connection part 1011 extends in a direction perpendicular to a direction from the first base 11 to the second base 12. The connection blade 1012 is connected to one side of the connection part 1011 and extends in a direction away from the connection part 1011. One end of the connection blade 1012 that is not connected to the connection part 1011 is rotatably connected to the first adapter 103. The connection blade 1012 is rotatably connected to the first base 11. The connection blade 1022 of the second connection piece 102 is rotatably connected to the second adapter 104, and is rotatably connected to the second base 12.

The first connection piece 101 may have a single connection blade 1012 located between two adjacent first blades 1031. Alternatively, the first connection piece 101 may have a plurality of connection blades 1012 parallel to each other, and the first blade 1031 is disposed between every two adjacent connection blades 1012. Alternatively, the first connection piece 101 has a plurality of connection blades 1012, and there are a plurality of first blades 1031. The first blade 1031 is disposed between every two adjacent connection blades 1012. The connection blade 1012 is disposed between every two adjacent first blades 1031. The connection blades 1012 and the first blades 1031 may be alternately disposed one by one. The connection blade 1012 of the first connection piece 101 is in damping connection to the first blade 1031. A surface of the first blade 1031 that faces the connection blade 1012 is tightly attached to a surface of the connection blade 1012 that faces the first blade 1031. When the connection blade 1012 rotates relative to the first blade 1031, a damping force is generated between the first blade 1031 and the connection blade 1012. In this way, a damping connection is achieved between the first blade 1031 and the connection blade 1012. In other words, when the first connection piece 101 rotates relative to the first adapter 103, a rotation angle of the first connection piece 101 relative to the first adapter 103 is controlled by the damping force between the first blade 1031 and the connection blade 1012.

A disposing manner of the connection blade 1022 of the second connection piece 102 is the same as that of the connection blade 1012 of the first connection piece 101, and details are not described herein again. Similarly, a rotation angle of the second adapter 104 relative to the second connection piece 102 can also be controlled by a damping connection between the connection blade 1022 of the second connection piece 102 and the second blade 1041.

When the connection component 1 in this embodiment is in use, the first connection piece 101 rotates relative to the first adapter 103, the first adapter 103 rotates relative to the second adapter 104, and the second adapter 104 rotates relative to the second connection piece 102. A rotation angle of the first connection piece 101 relative to the first adapter 103, that of the first adapter 103 relative to the second adapter 104, and that of the second adapter 104 relative to the second connection piece 102 can be controlled mainly due to a damping connection between the connection blade 1012 of the first connection piece 101 and the first blade 1031, that between the first blade 1031 and the second blade 1041, and that between the second blade 1041 and the connection blade 1022 of the second connection piece 102.

When the first connection piece 101 rotates relative to the first adapter 103, the first adapter 103 rotates relative to the second adapter 104, and the second adapter 104 rotates relative to the second connection piece 102, friction is generated separately between the connection blade 1012 of the first connection piece 101 and the first blade 1031, between the first blade 1031 and the second blade 1041, and between the second blade 1041 and the connection blade 1022 of the second connection piece 102, to control a rotation angle of the first connection piece 101 relative to the first adapter 103, that of the first adapter 103 relative to the second adapter 104, and that of the second adapter 104 relative to the second connection piece 102. By adjusting quantities of connection blades 1012 of the first connection piece 101, first blades 1031, second blades 1041, and connection blades 1022 of the second connection piece 102, a contact area between the connection blade 1012 of the first connection piece 101 and the first blade 1031, that between the first blade 1031 and the second blade 1041, and that between the second blade 1041 and the connection blade 1022 of the second connection piece 102 can be adjusted, to further adjust a damping force between the connection blade 1012 of the first connection piece 101 and the first blade 1031, that between the first blade 1031 and the second blade 1041, and that between the second blade 1041 and the connection blade 1022 of the second connection piece 102.

Still referring to FIG. 1 and FIG. 2, the first base 11 has a structure basically the same as that of the second base 12. The following first describes the structure of the first base 11. The first base 11 includes a base plate 111 and a base cover 112. A mounting groove 1111 is formed in the base plate 111. The base cover 112 is detachably mounted on the base plate 111. A through hole 1121 is formed in the base cover 112 and correspondingly connected to the mounting groove 1111. The through hole 1121 and the mounting groove 1111 jointly form the first accommodation groove (113). At least one of the base plate 111 and the base cover 112 is rotatably connected to the first pivot shaft 1010. In this embodiment, the first pivot shaft 1010 is rotatably connected to the base plate 111 and the base cover 112.

Similarly, the second base 12 includes a base plate 121 and a base cover 122. Structures of the base plate 121 and the base cover 122 of the second base 12 are the same as those of the base plate 111 and the base cover 112 of the first base 11. A mounting groove 1211 of the base plate 121 and a through hole 1221 of the base cover 122 of the second base 12 jointly form the second accommodation groove (123). At least one of the base plate 121 and the base cover 122 of the second base 12 is rotatably connected to the second pivot shaft 1020. In this embodiment, the second pivot shaft 1020 is rotatably connected to the base plate 121 and the base cover 122 of the second base 12.

In this embodiment, the first pivot shaft 1010 is rotatably connected to the base plate 111 and the base cover 112 of the first base 11. A first groove body 1112 is disposed on the base plate 111 of the first base 11 and a second groove body (not shown in the figure) is disposed on the base cover 112 of the first base 11. The first groove body 1112 and the second groove body (not shown in the figure) jointly form a shaft groove. The first pivot shaft 1010 is rotatably fitted in the shaft groove. Similarly, the second base 12 has a same structure as the first base 11 so that the second pivot shaft 1020 is rotatably fitted in a shaft groove of the second base 12. Details are not described herein again.

The base cover 111 of the first base 11 is detachably mounted on the base plate 111 of the first base 11 by using a connection piece 13. Similarly, the base cover 122 of the second base 12 is detachably mounted on the base plate 121 of the second base 12 by using another connection piece 13. The connection piece 13 is a threaded connection piece. There may be a plurality of connection pieces 13 distributed at intervals on the first base 11 and the second base 12.

Figure 4:
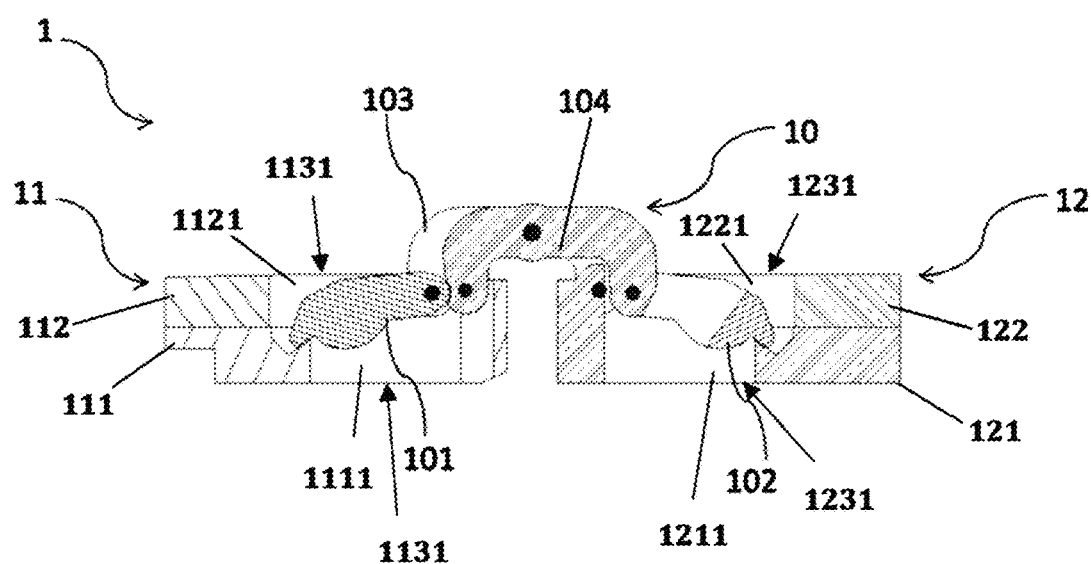
FIG. 4 to FIG. 8 are diagrams of usage states of the connection component according to the first embodiment of the present disclosure.
Figure 5:
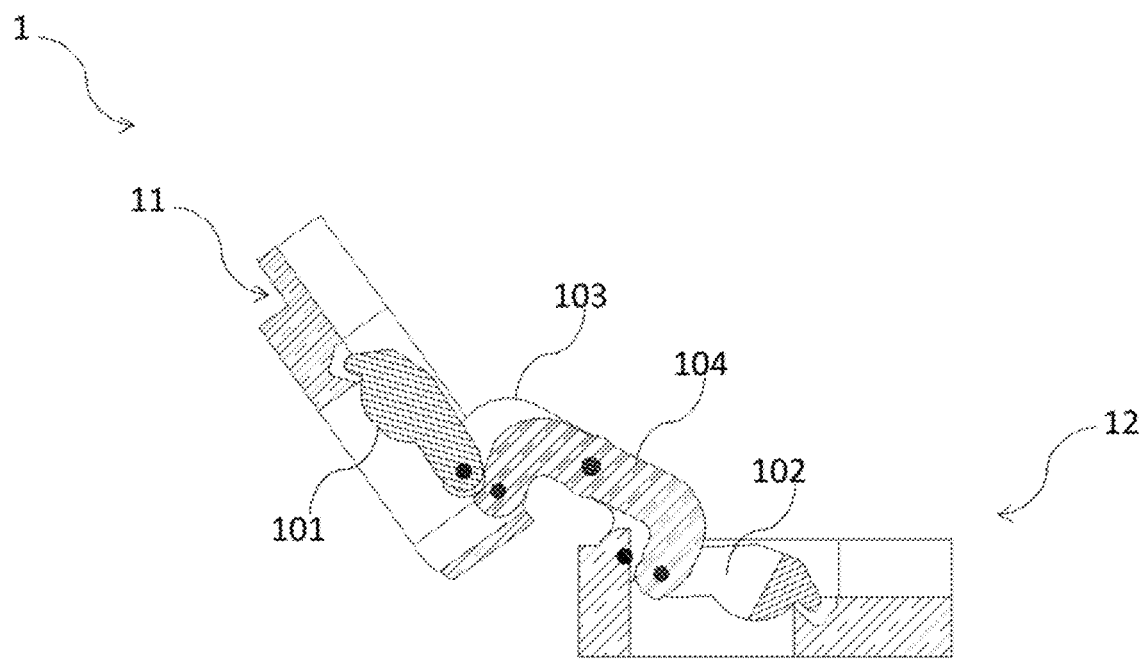
Figure 6:
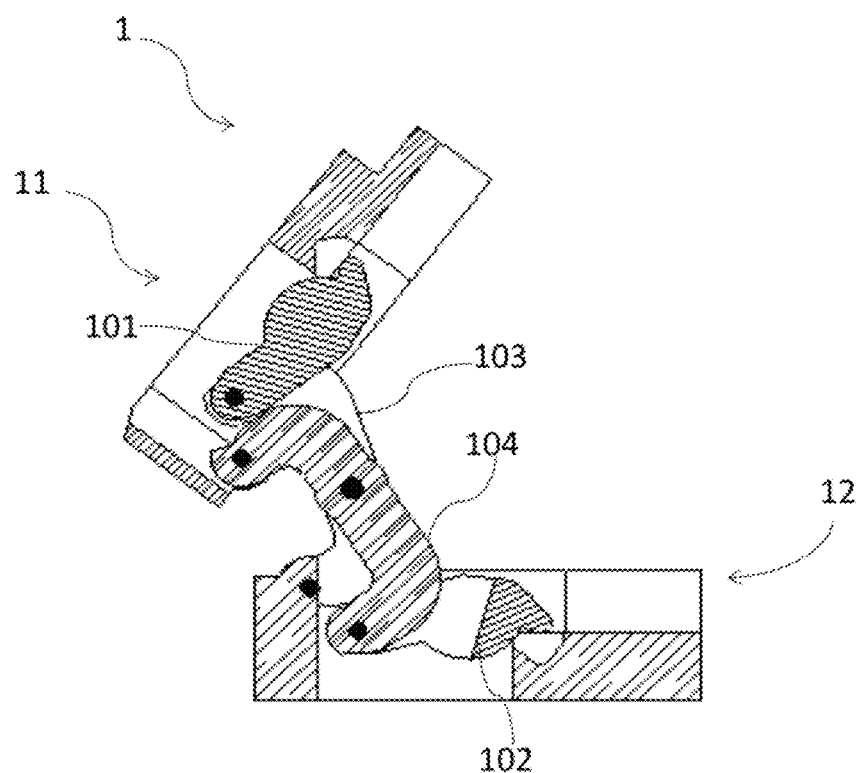
Figure 7:
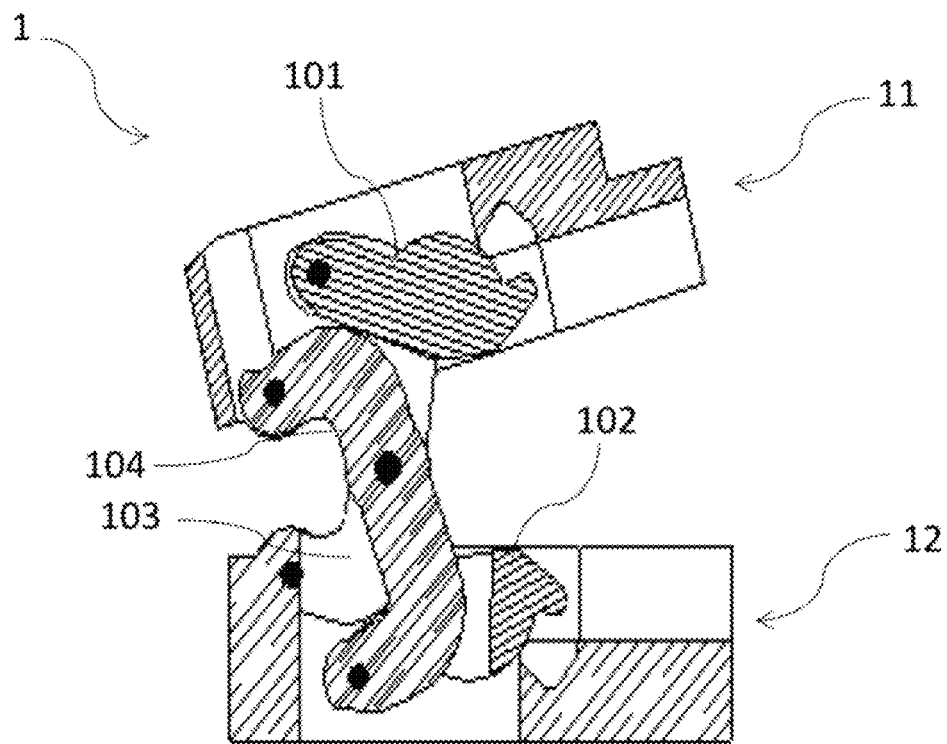

FIG. 4 to FIG. 8 are diagrams of usage states of the connection component according to the first embodiment of the present disclosure. FIG. 4 shows an extended state of the connection component 1. In this case, the first connection piece 101 and the second connection piece 102 of the connection mechanism 10 are located in the first accommodation groove (113) and the second accommodation groove (123), respectively. When the first base 11 rotates relative to the second base 12, the first base 11 drives the first connection piece 101 and the first adapter 103 to rotate relative to the second base 12. When the first adapter 103 rotates relative to the second base 12, the second adapter 104 drives the second connection piece 102 to rotate around the second pivot shaft 1020 of the second connection piece 102. One end of the second connection piece 102 that is connected to the second adapter 104 moves towards an interior of the second accommodation groove (123) of the second base 12.

Figure 8:
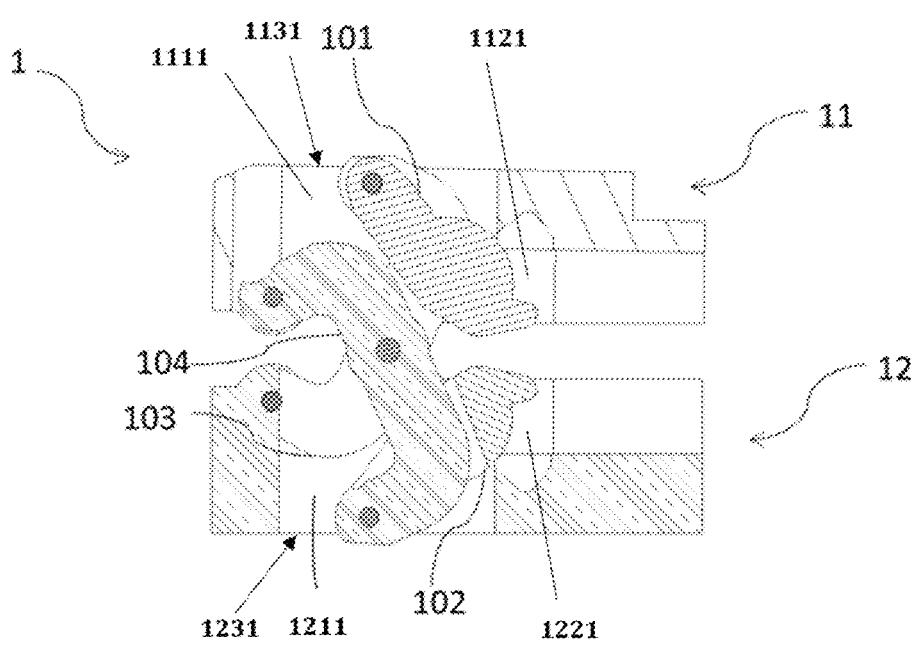

In addition, one end of the second connection piece 102 that is connected to the second adapter 104 drives the second adapter 104 to rotate around a middle of the second adapter 104. The second adapter 104 is staggered with the first adapter 103. A second end of the first adapter 103 abuts against the connection blade 1022 of the first connection piece 101 to drive the first connection piece 101 to rotate around the first pivot shaft 1010 (shown in FIG. 2) of the first connection piece 101. One end of the first connection piece 101 that is connected to the first adapter 103 moves towards an interior of the first accommodation groove (113) of the first base 11. When the first base 11 and the second base 12 are overlapped (as shown in FIG. 8), the first accommodation groove (113) is opposite to the second accommodation groove (123), and the connection mechanism 10 is accommodated in the first accommodation groove (113) and the second accommodation groove (123).

Figure 9:
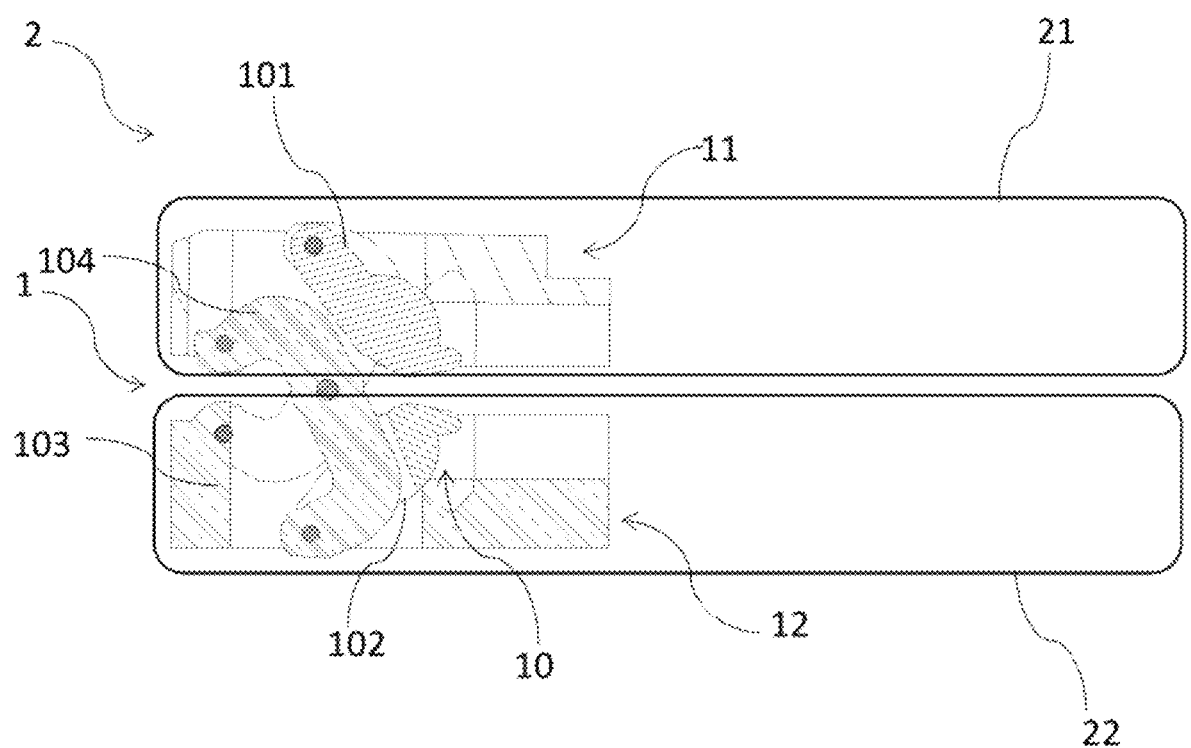
FIG. 9 is schematic diagram of a mobile terminal according to a second embodiment of the present disclosure.

FIG. 9 is a schematic diagram of a mobile terminal according to a second embodiment of the present disclosure. As shown in the figure, this embodiment provides a mobile terminal 2. The mobile terminal 2 includes a first display component 21, a second display component 22, and the connection component 1 provided in the foregoing embodiment. The connection component 1 connects the first display component 21 to the second display component 22. The first base 11 is connected to the first display component 21. The second base 12 is connected to the second display component 22. When the mobile terminal 2 is in a folded state, the connection component 1 is located between the first display component 21 and the second display component 22. In other words, the connection component 1 is not exposed on outer surfaces of the first display component 21 and the second display component 22. Therefore, the connection component 1 is not exposed, preventing an appearance and a sense of gripping of the mobile terminal from being affected in the folded state. However, when the connection component 1 is in use, the connection component 1 can control, via friction between a plurality of blades, a rotation angle of the first connection piece 101 relative to the first adapter 103, that of the first adapter 103 relative to the second adapter 104, and that of the second adapter 104 relative to the second connection piece 102. That is, the first display component 21 can rotate relative to the second display component 22 via the connection component 1, and the rotation angle of the first display component 21 relative to the second display component 22 can be controlled, so that the first display component 21 can be suspended at any angle.

The first display component 21 has a first display screen (not shown in the figure), and the second display component 22 has a second display screen (not shown in the figure). When the mobile terminal 2 is in a folded state, the first display screen and the second display screen are disposed face to face. Alternatively, the first display screen and the second display screen are disposed away from each other back to back. Alternatively, the first display screen and the second display screen are disposed at an interval and face a same direction.

In view of the above, according to the connection component and the mobile terminal provided in the present disclosure, a connection component is used to replace a rotating shaft of a current foldable electronic device. When the foldable electronic device is in a folded state, the connection component can be hidden in the foldable electronic device, which does not affect a user's sense of gripping, or spoil an appearance of the foldable electronic device. A plurality of damping blades of the connection component in the present disclosure abut against each other and are pivotally connected. When a plurality of damping blades of a first rotating shaft mechanism and a plurality of damping blades of a second rotating shaft mechanism pivot on one another, friction is generated between the plurality of damping blades. Therefore, the connection component can be suspended at any angle, and the damping force of the connection component can be adjusted by adjusting a quantity of damping blades, to enable the connection component to pivot smoothly.

It should be noted that, in this specification, the terms "include", "comprise", or any of their variants are intended to cover a non-exclusive inclusion, so that a process, a method, an article, or an apparatus that includes a series of elements not only includes those elements but also includes other elements that are not expressly listed, or further includes elements inherent to such a process, method, article, or apparatus. An element limited by "includes a . . . " does not, without more constraints, preclude the presence of additional identical elements in the process, method, article, or apparatus that includes the element.

The embodiments of the present disclosure are described above with reference to the accompanying drawings. However, the present disclosure is not limited to the foregoing specific implementations. The foregoing specific implementations are merely exemplary, but are not limiting. Under the enlightenment of the present disclosure, a person of ordinary skill in the art may make many forms without departing from the objective and the scope of the claims of the present disclosure, and all of which fall within the protection of the present disclosure.

The invention claimed is:

1. A connection component, comprising:
a first base, wherein the first base comprises a first accommodation groove;
a second base, wherein the second base comprises a second accommodation groove; and
a connection mechanism, wherein the connection mechanism is rotatably connected to the first base and the second base separately to enable the first base and the second base to switch between an extended state and a folded state, wherein
in the extended state, the first base and the second base are adjacent and coplanar, and the opening of the first accommodation groove is adjacent to the opening of the second accommodation groove; and
in the folded state, the first base and the second base are overlapped, the opening of the first accommodation groove is opposite to the opening of the second accommodation groove, and the connection mechanism is accommodated in the first accommodation groove and the second accommodation groove;
wherein the connection mechanism comprises:
a first connection piece, wherein the first connection piece is rotatably connected to the first base, and the first connection piece is located in the first accommodation groove;
a second connection piece, wherein the second connection piece is rotatably connected to the second base, and the second connection piece is located in the second accommodation groove;
a first adapter, wherein the first adapter is disposed between the first connection piece and the second connection piece, a first end of the first adapter is rotatably connected to the first connection piece, and a second end of the first adapter is rotatably connected to the second base; and
a second adapter, wherein the second adapter is disposed between the first adapter and the second connection piece, a first end of the second adapter is rotatably connected to the second connection piece, a second end of the second adapter is rotatably connected to the first base, and the second adapter is rotatably connected to the first adapter;
wherein
the first connection piece has a first pivot shaft, and the first pivot shaft is rotatably connected to the first base; and
the second connection piece has a second pivot shaft, and the second pivot shaft is rotatably connected to the second base;
wherein the first base comprises:
a base plate, wherein a mounting groove is formed in the base plate; and
a base cover, wherein the base cover is detachably mounted on the base plate, a through hole is formed in the base cover, the through hole is correspondingly connected to the mounting groove, the through hole and the mounting groove jointly form the first accommodation groove, and at least one of the base plate and the base cover is rotatably connected to the first pivot shaft.

2. The connection component according to claim 1, wherein
   the first adapter is formed as a first blade, the second adapter is formed as a second blade, both the first blade and the second blade are sheet structures, and
   the first blade is disposed in parallel to the second blade, and a middle of the first blade is rotatably connected to that of the second blade.

3. The connection component according to claim 2, wherein the first blade comprises:
   a body part, wherein the body part extends in a direction from the first base to the second base, and is rotatably connected to the second blade;
   a first adapter wing, wherein the first adapter wing is connected to an axial end of the body part, extends from one side of the body part towards a direction away from the body part, and is rotatably connected to the first connection piece; and
   a second adapter wing, wherein the second adapter wing is connected to the other axial end of the body part, extends from the side of the body part towards a direction away from the body part, and is rotatably connected to the second base, wherein
   the body part, the first adapter wing, and the second adapter wing are coplanar.

4. The connection component according to claim 2, wherein the second blade comprises:
   a body part, wherein the body part extends in a direction from the second base to the first base, and is rotatably connected to the first blade;
   a first adapter wing, wherein the first adapter wing is connected to an axial end of the body part, extends from one side of the body part towards a direction away from the body part, and is rotatably connected to the second connection piece; and
   a second adapter wing, wherein the second adapter wing is connected to the other axial end of the body part, extends from the side of the body part towards a direction away from the body part, and is rotatably connected to the first base, wherein
   the body part, the first adapter wing, and the second adapter wing are coplanar.

5. The connection component according to claim 3, wherein the first adapter wing is parallel to the second adapter wing, and the first adapter wing and the second adapter wing are separately orthogonal to the body part.

6. The connection component according to claim 2, wherein there are a plurality of first blades parallel to each other.

7. The connection component according to claim 6, wherein the plurality of first blades are disposed at intervals, and the second blade is disposed between every two adjacent first blades.

8. The connection component according to claim 2, wherein there are a plurality of first blades parallel to each other, and there are a plurality of second blades parallel to each other.

9. The connection component according to claim 8, wherein
   the plurality of first blades are disposed at intervals, and the plurality of second blades are disposed at intervals;
   the second blade is disposed between every two adjacent first blades; and
   the first blade is disposed between every two adjacent second blades.

10. The connection component according to claim 9, wherein the first blades and the second blades are alternately arranged one by one.

11. The connection component according to claim 1, wherein the first connection piece comprises:
   a connection part, wherein the connection part extends in a direction perpendicular to a direction from the first base to the second base; and
   a connection blade, wherein the connection blade is a sheet structure, and the connection blade is connected to one side of the connection part, extends from one side of the connection part towards a direction away from the connection part, and is rotatably connected to the first adapter and the first base.

12. The connection component according to claim 1, wherein the second connection piece comprises:
   a connection part, wherein the connection part extends in a direction perpendicular to a direction from the first base to the second base; and
   a connection blade, wherein the connection blade is a sheet structure, and the connection blade is connected to one side of the connection part, extends from one side of the connection part towards a direction away from the connection part, and is rotatably connected to the second adapter and the second base.

13. The connection component according to claim 1, wherein a first groove body is disposed on the base plate, a second groove body is disposed on the base cover, the first groove body and the second groove body jointly form a shaft groove, and the first pivot shaft is rotatably fitted in the shaft groove.

14. The connection component according to claim 1, wherein the base cover is detachably mounted on the base plate by using a connection piece;
   wherein the connection piece is a threaded connection piece;
   wherein there are a plurality of connection pieces distributed at intervals.

15. A mobile terminal, comprising:
   a first display component;
   a second display component; and
   a connection component, wherein the connection component connects the first display component to the second display component, and the connection component comprises:
   a first base, wherein the first base comprises a first accommodation groove;
   a second base, wherein the second base comprises a second accommodation groove; and
   a connection mechanism, wherein the connection mechanism is rotatably connected to the first base and the second base separately to enable the first base and the second base to switch between an extended state and a folded state, wherein
   in the extended state, the first base and the second base are adjacent and coplanar, and the opening of the first accommodation groove is adjacent to the opening of the second accommodation groove;
   in the folded state, the first base and the second base are overlapped, the opening of the first accommodation groove is opposite to the opening of the second accommodation groove, and the connection mechanism is accommodated in the first accommodation groove and the second accommodation groove;
   the first base is connected to the first display component, and the second base is connected to the second display component;

wherein the connection mechanism comprises:

a first connection piece, wherein the first connection piece is rotatably connected to the first base, and the first connection piece is located in the first accommodation groove;

a second connection piece, wherein the second connection piece is rotatably connected to the second base, and the second connection piece is located in the second accommodation groove;

a first adapter, wherein the first adapter is disposed between the first connection piece and the second connection piece, a first end of the first adapter is rotatably connected to the first connection piece, and a second end of the first adapter is rotatably connected to the second base; and a second adapter, wherein the second adapter is disposed between the first adapter and the second connection piece, a first end of the second adapter is rotatably connected to the second connection piece, a second end of the second adapter is rotatably connected to the first base, and the second adapter is rotatably connected to the first adapter;

wherein the first connection piece has a first pivot shaft, and the first pivot shaft is rotatably connected to the first base; and the second connection piece has a second pivot shaft, and the second pivot shaft is rotatably connected to the second base;

wherein the first base comprises:

a base plate, wherein a mounting groove is formed in the base plate; and a base cover, wherein the base cover is detachably mounted on the base plate, a through hole is formed in the base cover, the through hole is correspondingly connected to the mounting groove, the through hole and the mounting groove jointly form the first accommodation groove, and at least one of the base plate and the base cover is rotatably connected to the first pivot shaft.

16. The mobile terminal according to claim 15, wherein the first display component has a first display screen, and the second display component has a second display screen.

* * * * *